United States Patent
Orcutt (10) Patent No.: US 7,468,826 B2
(45) Date of Patent: Dec. 23, 2008

(54) SILICON MIRRORS HAVING REDUCED HINGE STRESS FROM TEMPERATURE VARIATIONS

(75) Inventor: John W. Orcutt, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 983 days.

(21) Appl. No.: 10/138,402

(22) Filed: May 3, 2002

(65) Prior Publication Data

US 2003/0206356 A1 Nov. 6, 2003

(51) Int. Cl.
*G02B 26/08* (2006.01)
(52) U.S. Cl. .................................. 359/226; 359/223
(58) Field of Classification Search ......... 359/223–226, 359/290–291
See application file for complete search history.

(56) References Cited

U.S. PATENT DOCUMENTS

| | | | | |
|---|---|---|---|---|
| 5,650,881 A * | 7/1997 | Hornbeck | ................... | 359/871 |
| 5,969,465 A * | 10/1999 | Neukermans et al. | ....... | 310/333 |
| 6,040,935 A * | 3/2000 | Michalicek | ................ | 359/198 |
| 6,428,173 B1 * | 8/2002 | Dhuler et al. | ................ | 359/872 |
| 6,519,075 B2 * | 2/2003 | Carr et al. | ................... | 359/291 |
| 6,706,202 B1 * | 3/2004 | Sun et al. | ...................... | 216/24 |
| 6,735,004 B1 * | 5/2004 | Hagelin et al. | .............. | 359/198 |

* cited by examiner

*Primary Examiner*—Joshua L Pritchett
(74) *Attorney, Agent, or Firm*—William B. Kempler; W. James Brady, III; Frederick J. Telecky, Jr.

(57) ABSTRACT

A device such as a mirror assembly comprises a movable structure (41) having a first movable portion (45) hinged to a frame portion (43) by a first pair of torsional hinges (47A and 47B) spaced apart along a first axis (49). The device may also have a second movable portion (51) and a second pivot axis provided by set of torsional hinge (53A and 53B). The movable structure or mirror assembly (41) having a first coefficient of expansion is attached to a support structure (42) having a different coefficient of expansion at a single attaching or anchor point (63) such as by epoxy or a clamp (101). The single attaching point (63) allows expansion and/or contraction along two dimensions and thereby prevents compression and/or tension forces resulting from different coefficients of expansion between the mirror assembly 41 and the support structure 42 from being applied to the torsional hinges 47A, 47B, 53A and 53B. One embodiment of the invention also includes a biasing member or finger (105) which bears against the frame portion 43 of mirror assembly 41 to prevent vibrations in the third dimension.

22 Claims, 5 Drawing Sheets

FIG. 8B

SILICON MIRRORS HAVING REDUCED HINGE STRESS FROM TEMPERATURE VARIATIONS

FIELD OF THE INVENTION

The present invention generally relates to devices having at least one torsional hinge, and more particularly to MEMS (micro-electro mechanical systems) optical devices with movable mirrors and a method of packaging such movable mirrors to eliminate and/or reduce stress in the torsional hinge resulting from temperature variations and differences in the coefficient of expansion of the mirror and the support structure on which the mirror is mounted.

BACKGROUND

In recent years optical fibers have come into wide spread use in a wide variety of applications in which optical signals are transmitted along such fibers and are switched from one optical fiber to another using an optical switch system. Optical switches generally include structure to support fiber positioning, alignment signal emitters and interconnected computer control electronics. A fiber positioning structure is provided near the end of each fiber to selectively point the end of a fiber to one fiber group toward the end of a selected fiber in another fiber group to provide switched optical transmission between the two fibers. Examples of optical switches are shown in U.S. Pat. Nos. 4,512,036 and 5,177,348.

Movable mirrors having torsional hinges are may be used as the switching device in such optical switching systems to reflect, route, and/or attenuate light of the optical signals. However, the durability and life span of current torsion-hinge movable mirror devices have suffered due to failures in the torsional hinge that allows pivoting of the devices. Such failures are at least partly because the torsional hinge of the mirror devices often experience stress due to different coefficients of expansion between the silicon mirror and the support structure on which the mirror is mounted. In other words, temperature variations may cause a hinge of the movable mirror device to experience compression and possibly even tension forces due to different coefficients of expansion of the device components. Since such stresses may cause the failure of these devices, there is a need for reducing or eliminating such unwanted or unintended stresses experienced by the hinges of a torsion-hinge movable mirror device.

Texas Instruments presently manufactures a two-axis analog mirror MEMS device fabricated out of a single piece of material (such as silicon, for example) typically having a thickness of about 100-115 microns. The layout consists of an oval mirror (normally about 3.8 mm×3.2 mm) supported on a gimbal frame by two silicon torsional hinges. The gimbal frame is attached to a support frame by another set of torsional hinges, and the support frame is mounted to a support structure that may be manufactured from a ceramic or plastic material which has a coefficient of expansion different than the silicon. A similar single axis mirror MEMS device may be manufactured by eliminating the gimbal frame, and hinging the mirror directly to the support frame.

BRIEF SUMMARY OF THE INVENTION

The problems mentioned above are addressed by the present invention, which according to one embodiment, provides a movable structure such as a mirror structure that includes a support portion and a movable inside portion made of a first material such as silicon. The inside portion is hinged to the support portion by a first pair of torsional hinges spaced apart along an axis, such that the inside portion can pivot about the axis relative to the support portion. The movable structure is attached or anchored to a support structure which is made from a second material such as plastic, ceramic or other materials. Typically, the material from which the support structure is made will have a coefficient of expansion that is different than the coefficient of expansion of the movable structure. However, contrary to what would appear to be intuitive, instead of securing the full perimeter or at least a portion of all sides of the movable structure frame portion to the support structure, according to the present invention, the structure is anchored or attached to the support structure at a single location. The structure is anchored or attached, for example, by a clamp or a small spot or dab of adhesive at the single location. By using a single attaching location such as at a corner, the structure is able to expand or contract along two dimensions with respect to the anchor point.

As indicated above, in accordance with one embodiment of the present invention, the movable structure is an optical device having a structure as discussed above wherein the movable inside portion is a mirror formed from a single piece of substantially planar reflective material such as silicon.

According to still another embodiment, the optical device may be an inner mirror portion having a reflective mirror surface formed thereon, and may further comprise another or second movable portion such as an intermediate gimbals portion. The second movable portion may be hinged to the first mentioned movable portion by another set or pair of hinges spaced apart along a second axis in the plane, such that the second movable portion can pivot relative to the first mentioned movable portion about the second axis.

According to another embodiment, the first axis will be substantially perpendicular to the second axis so as to form a two-axis device.

BRIEF DESCRIPTION OF THE DRAWINGS

Other objects and advantages of the invention will become apparent upon reading the following detailed description and upon referencing the accompanying drawings, in which.

DETAILED DESCRIPTION OF EMBODIMENTS OF THE INVENTION

Like reference numbers in the figures are used herein to designate like elements throughout the various views of the present invention. The figures are not intended to be drawn to scale, and in some instances for illustrative purposes, the drawings may intentionally not be to scale. One of ordinary skill in the art will appreciate the many possible applications and variations of the present invention based on the following examples of possible embodiments of the present invention.

The present invention relates to a device with a movable structure that has torsional hinges and is secured to a support structure having a different coefficient of expansion such that the torsional hinges are subjected to minimal or zero stress due to temperature variations.

Figures 1, 4:
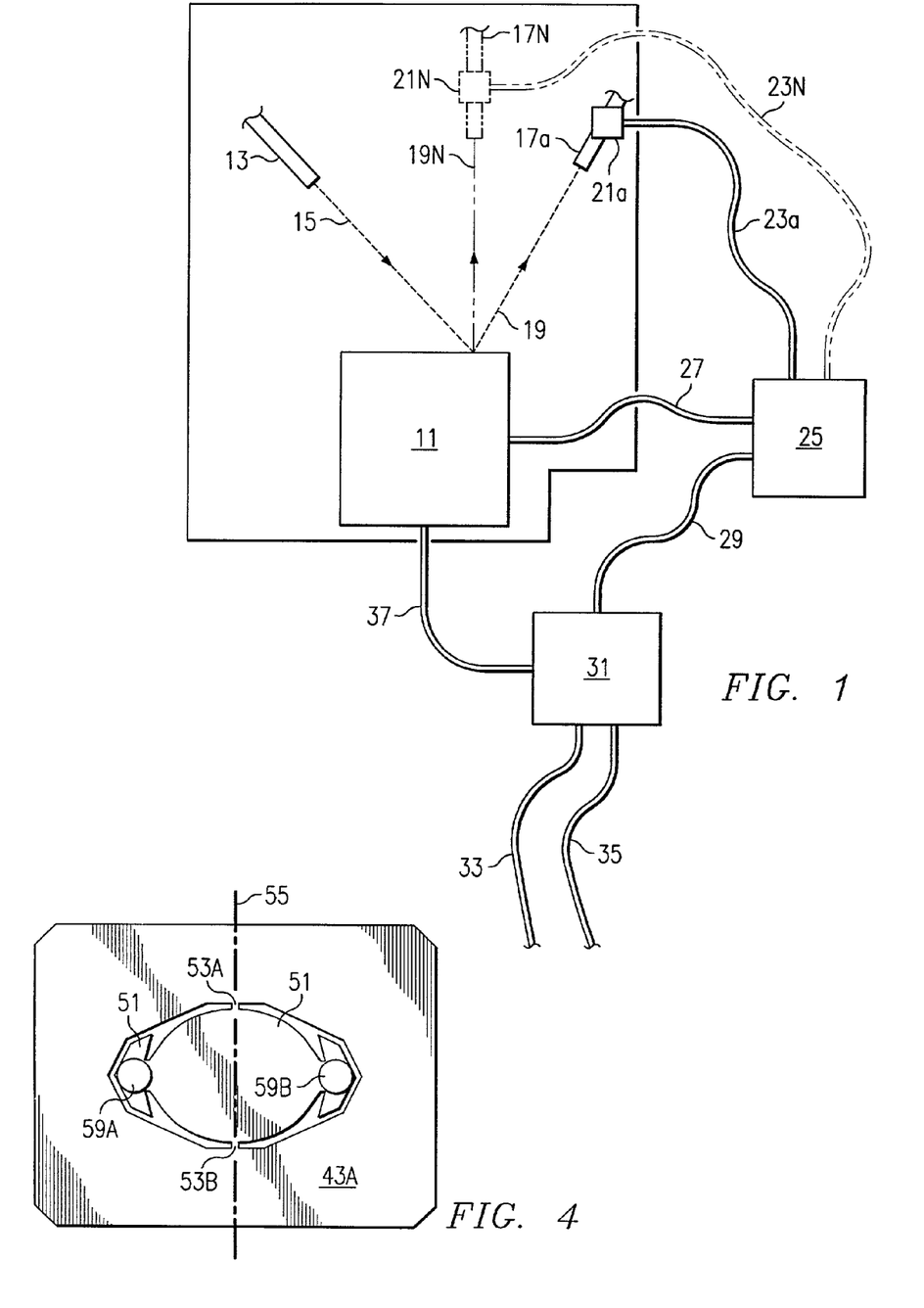
FIG. 1 is a diagrammatic representation of an optical switching system using an array of mirrors that are selectively rotatable about at least one axis.
FIG. 4 is a top view of a single axis mirror device suitable for making up an array of mirrors used in a switching system of FIG. 1.

Referring now to FIG. 1, there is shown a system level diagram for providing optical switches using an array of analog mirrors. As shown in FIG. 1a, there is included optical switching apparatus 11 comprising an array of optical mirrors, the associated drivers and the position monitoring electronics. In the illustrated embodiment, there is a source fiber optic 13 which is providing an optical signal carrying data such as a laser beam 15. Also as shown, there is a second optical fiber 17a which is indicated as receiving an optical signal 19 from a mirror on the array of mirrors (not shown) in apparatus 11. There is also another receiving fiber 17n indicated by dotted lines. It will be appreciated by those skilled in the art, that although there is only one source fiber optic 13 and only two receiving fiber optics 17a and 17n illustrated in the diagram, there may be tens, hundreds or even thousands of both the source fibers and the receiving fibers as indicated by the letter "n" for the receiving fiber optic 17n. Although there may be a huge multiplicity of such optical fibers, it is only necessary to illustrate one emitting fiber (13) and one receiving fiber (17a) to describe the features of the present invention. However, the reader should understand that everything discussed with respect to source fiber 13 and receiving fiber optic 17a is true for the other multiplicity of fiber optics that may be included. Also as shown, fiber optic 17a includes a beam monitor device 21a for sensing the optical signal strength. The beam monitoring device 21a converts the optical signal to an electrical signal representative of the strength of the beam and provides an electrical signal representative to electrical or feedback cables 23a. Feedback cable 23a goes to a system control box 25, and as will become clear, system control box 25 also receives signals on cable 27 indicative of the position of each of the mirrors of the array of mirrors in the apparatus 11. For a two-axis analog mirror in the array, there may typically be feedback signals provided from four different sensors in apparatus 11 for each of the mirrors of the array. System control box 25 provides the necessary control information signals on cable 29 to the drive electronics 31. Also as shown, drive electronics 31 receives a ground and power line 33 and 35 as indicated. Drive electronics 31 provides the drive signals to the apparatus (such as drive coils or electrostatic plates) used to position the mirrors. These drive signals along with the power and ground lines are provided by cable 37. If the array of mirrors is comprised of two axis mirrors provides a drive signal will require three or four lines for each of the mirrors of the array. In addition, if the mirror positioning signals are four photodiodes, there typically will be also at least one power signal to an LED associated with each of the mirrors.

As was discussed above, apparatus 11 of FIG. 1 includes an array of mirror devices. Since each of the mirrors of a mirror array operate in the same manner, FIG. 2 illustrates a single mirror of the type used in an array of two-axis mirrors.

Figures 2, 3A:
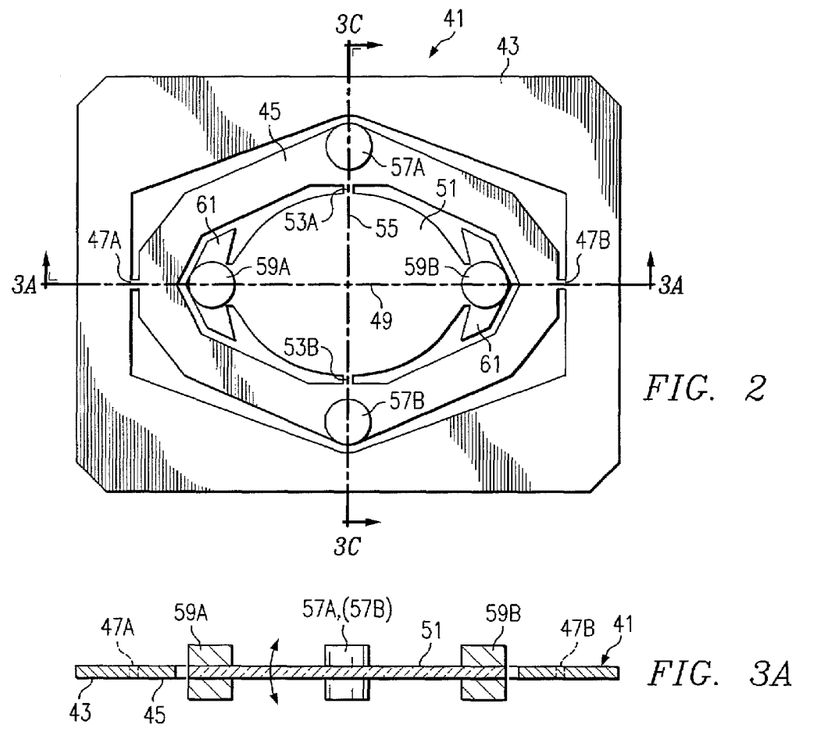
FIG. 2 is a top view of a single two-axis mirror device of the type used to make up an array of such two-axis mirrors used in the switching system of FIG. 1.
FIGS. 3a through 3d are cross-sectional views of FIG. 2 illustrating rotation or pivoting of the two sets of torsional hinges.
Figure 3B:
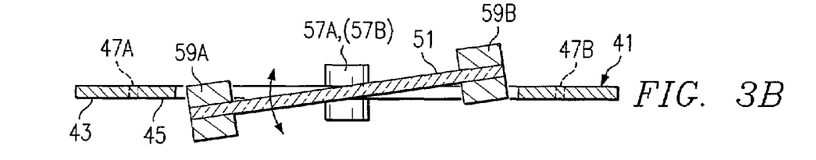
Figure 3C:
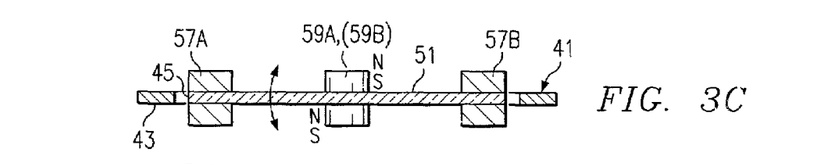
Figure 3D:
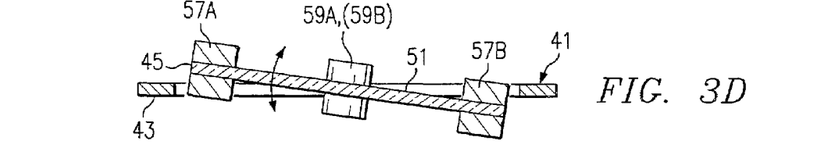

Mirror assembly 41, as shown in FIG. 2, includes a frame or support portion, an intermediate gimbals portion and an inside mirror portion preferably formed from one piece of crystalline material such as silicon. The silicon is etched to provide outer frame or support portion 43 forming an opening in which intermediate gimbals portion 45 is attached at opposing hinge locations 47A and 47B along first axis 49. An inner, centrally disposed mirror portion 51 is attached to gimbals portion 45 at hinges 53A and 53B along a second axis 55 that is orthogonal to or rotated, 90° from the first axis. The mirror portion 51, which is on the order of 100-115 microns in thickness, is suitably polished on its upper surface to provide a specular or mirror surface. In order to provide necessary flatness, the mirror is formed with a radius of curvature greater than approximately 2 meters, with increasing optical path lengths requiring an increased radius of curvature. The radius of curvature can be controlled by known stress control techniques such as, by polishing on both opposite faces and deposition techniques for stress controlled thin films. If desired, a coating of suitable material can be placed on the mirror portion to enhance its reflectivity for specific radiation wavelengths.

Mirror assembly 41 may also typically comprise a first pair of permanent magnets 57A and 57B mounted on gimbals portion 45 along the second axis 55 and a second pair of permanent magnets 59A and 59B mounted on extensions 61, which extend outwardly from mirror portion 51 along the first axis. In order to symmetrically distribute mass about the two axes of rotation to thereby minimize oscillation under shock and vibration, each permanent magnet 57A, 57B, 59A and 59B preferably comprises a set of an upper magnet mounted on the top surface of the mirror assembly 41 using conventional attachment techniques such as indium bonding, and an aligned lower magnet similarly attached to the lower surface of the mirror assembly as shown in FIGS. 3a-3d. The magnets of each set are arranged serially such as the north/south pole arrangement indicated in FIG. 3c. There are several possible arrangements of the four sets of magnets which may be used, such as all like poles up, or two sets of like poles up, two sets of like poles down; or three sets of like poles up, one set of like pole down, depending upon magnetic characteristics desired.

By mounting gimbals portion 45 to frame portion 43 by means of hinges 47A and 47B, motion of the gimbals portion 45 about the first axis 49 is provided. Similarly, by mounting mirror portion 51 to gimbals portion 45 via hinges 53A and 53B, motion of the mirror portion relative to the gimbals portion is obtained about the second axis 55, thereby allowing independent, selected movement of the mirror portion 51 along two different axes.

The middle or neutral position of mirror assembly 41 is shown in FIG. 3a, which is a section taken through the assembly along line 3A-3A of FIG. 3. Rotation of mirror portion 51 about axis 55 independent of intermediate gimbals portion 45 and/or frame portion 43 is shown in FIG. 3b as indicated by the arrow. FIG. 3c shows the middle position of the mirror assembly 41, similar to that shown in FIG. 3a, but taken along line 3C-3C of FIG. 2. Rotation of the intermediate or gimbals portion 45 and mirror portion 51 about axis 49 independent of frame or support portion 43 is shown in FIG. 3d as indicated by the arrow. The above independent rotation of mirror portion 51 about the two axes allows direction of optical beam 15 to the appropriate receiving optical fiber 17 through 17n as needed by the optical switch units and as discussed in FIG. 1.

In order to protect the torsional hinges 47A, 47B, 53A and 53B from in-plane shock, motion stops (not shown) may be provided on gimbals portion 45 and frame portion 43. At this point, it is again noted that the mirror assembly is on the order of 100-115 microns thick, whereas the hinges of the same thickness are on the order of 10 microns wide, thereby providing robust strength in directions normal to the surface of the assembly.

In addition, although FIG. 2 illustrates a two-axis mirror, it may be sufficient that the mirror rotate only about a single axis. Such an arrangement could of course use the two-axis mirror arrangement shown in FIG. 2, by not providing (or not activating) the drive mechanism for one of the axis. However, if a single axis operation is desired, a more rugged mirror arrangement would be to provide mirrors with only a signal axis 55 of rotation and a single pair of hinges 53A and 53B such as illustrated in FIG. 4.

Figure 5:
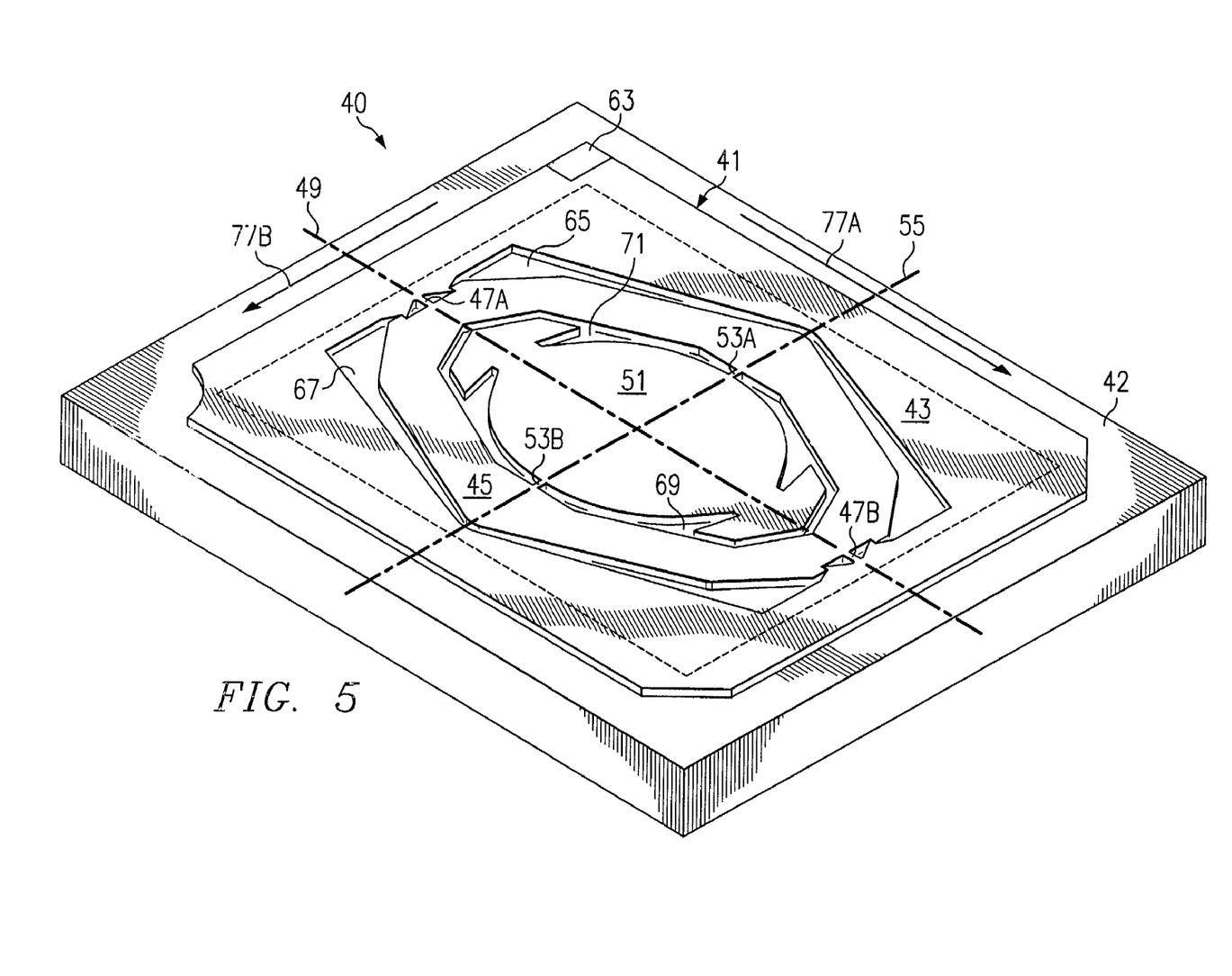
FIG. 5 is a perspective view of the two-axis mirror device of FIG. 2 generally illustrating the single point attaching concept of the present invention.

FIG. 5 shows a perspective view of the movable mirror assembly or apparatus 41 of FIG. 2 anchored or attached at a single location 63 to a support structure 42. As discussed above, the movable mirror assembly 41 is formed from a single piece of substantially planar material and the functional components are etched in the planar sheet of material (such as silicon) by techniques similar to those used in the semiconductor art. Some of the functional components include the frame or support portion 43, an intermediate or gimbals portion 45, and an inside mirror portion 51. Note that the shape and size of the apertures 65, 67, 69 and 71 etched in the silicon and used to define the functional components of the movable mirror assembly 41 may vary from those shown in the illustrative embodiments of the present invention. Hence, the size and shape of the functional components of the movable mirror assembly 41 may vary when applied to various embodiments of the present invention.

As was discussed above, the intermediate or gimbals portion 45 is hinged to the frame portion 43 at two ends by a first pair of hinges 47A and 47B spaced apart and aligned along a first axis 49. Except for the first pair of hinges 47A and 49B, the intermediate portion 45 is separated from the frame portion 43 by apertures 65 and 67 etched or otherwise formed in the planar silicon of the movable mirror assembly 41 (one on each side of the first axis 49). Hence, the intermediate or gimbals portion 45 can pivot about the first axis 49 on the first pair of hinges 47A and 47B relative to the frame portion 43. When the intermediate portion 45 pivots relative to the frame portion 43, the first pair of hinges 47A and 47B act as torsional springs. The width of the hinges 47A and 47B as an example only may be on the order of 10 microns. However, in other embodiments of the present invention, the thickness of the movable mirror assembly 41 and/or the width of the hinges 47A and 47B may vary as needed or as desired. Changing the dimensions of the hinges 47A and 47B will of course change the effective spring rate of the hinge, as well as the strength and durability. Thus, there is a balance between the desired spring rate for the hinges 47A and 47B and the desired strength and durability of the hinges.

Referring again to FIG. 5, the inner mirror portion 51 is coupled to the intermediate or gimbals portion 45 at two locations by a second pair of hinges 53A and 53B spaced apart and aligned along a second axis 55. In one embodiment, the first axis 49 is substantially perpendicular to the second axis 55. However, in other embodiments, the first axis may not always be perpendicular to the second axis. Except for the second pair of hinges 53A and 53B, the inner mirror portion 51 is completely separated from the intermediate gimbals portion 45 on each side of the second axis 55 by apertures 69 and 71 formed in the planar silicon of the movable mirror assembly 41. Hence, the inner mirror portion 51 can pivot about the second axis 55 on the second pair of hinges 53A and 53B relative to the intermediate portion 45. When the inner mirror portion 51 pivots relative to the intermediate gimbals portion 45, the second pair of hinges 53A and 53B also acts as torsional springs.

Figure 6:
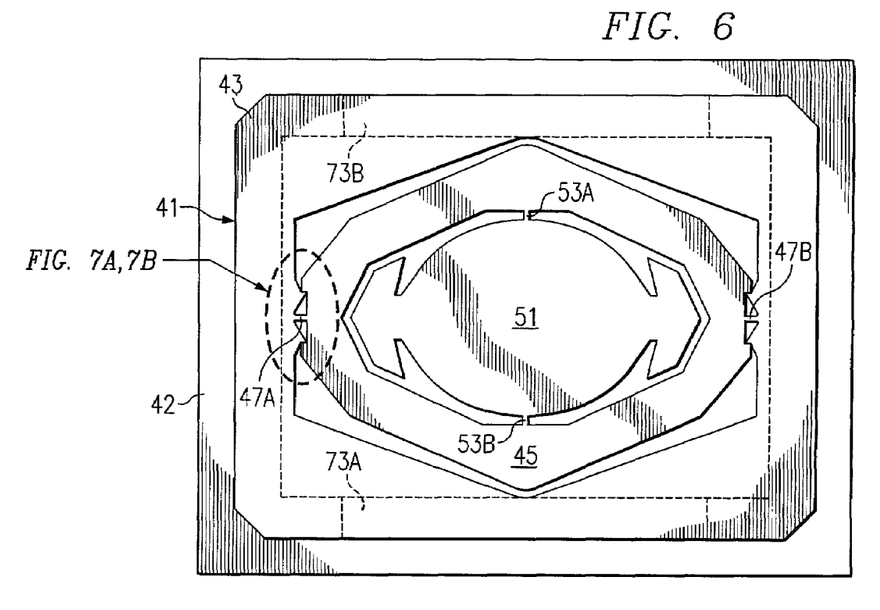
FIG. 6 is a top illustration of an earlier method of attaching the movable structure to a support structure.

Referring now to FIG. 6, there is shown a top view of a typical method of attaching a two-axis silicon mirror to a support structure. As shown, the outer frame or support portion 43 of movable mirror assembly 41 is attached to a support substrate 42 such as a PCB (printed circuit board) made from plastic or ceramic by two thin films or strips of epoxy or adhesive 73A and 73B applied between support substrate 42 and proximate two opposing edges of the frame or support portion 43 of mirror assembly 41.

Figure 7A:
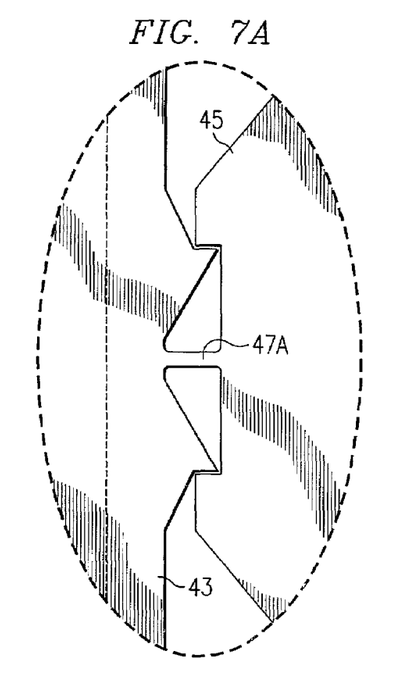
FIGS. 7a and 7b are enlarged views of a torsional hinge of the device of FIG. 5 illustrating the unstressed torsional hinge (FIG. 7a) and the hinge in compression due to temperature changes when the movable device frame portion is attached to a support frame in the manner shown in FIGS. 6a and 6b.
Figure 7B:
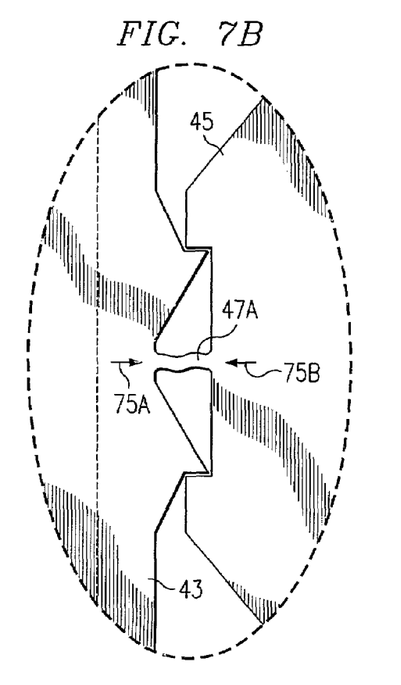

As shown, the very enlarged view of FIG. 7a, illustrates torsional hinge 47A in an unstressed state, such as just after the mirror assembly has been applied to the two thin strips 73A and 73B of epoxy film and while the epoxy is curing a temperature of about 100° C. However, after the attaching epoxy has cured and the temperature of the combination support structure 42 and the mirror assembly 41 has cooled down to ambient temperature (such as 25° C.), it has been found that compression forces such as indicated by arrows 75A and 75B in FIG. 7b are applied to the torsional hinge that may cause distortion of the hinge such as indicated by hinge 47A. These compression forces are generated as a result of the different coefficients of expansion between the silicon of the mirror assembly 41 and the support structure 42 which may be made from a material such as plastic or ceramic. The mirror assembly 41 may continue to operate even when the torsional hinges are in compression, but the reliability, life and durability of the assembly will be adversely affected. Although FIG. 7a only illustrates hinge 47A which extends between support portion 43 and intermediate or gimbals portion 45, it has been found that the compression forces generated due to the different coefficients of expansion are not only experienced by hinges 47A and 47B, but also by the torsional hinges 53A and 53B which extend between the intermediate gimbals portion 45 and the inner mirror portion 51. Thus, it will be understood that because the hinges 47A, 47B, 43A and 53B are typically one of the first components to fail in an optical switch device which uses a movable mirror assembly 41 with torsional hinges, an improvement to the reliability, life, and durability of the movable mirror assembly 41 may yield a direct improvement on the reliability, life, and durability of the optical switch device.

FIG. 5 illustrates one embodiment of the present invention. As was mentioned above, according to the embodiment of FIG. 5, the support portion 43 of the mirror assembly 41 is secured or attached to the support substrate 42 by a single anchor, such as for example a spot or dab of epoxy 63. Therefore, as indicated by arrows 77A and 77B, the movable mirror assembly 41 is free to expand or contract in these two dimensions independent of the expansion rate of the support substrate 42.

Figure 8A:
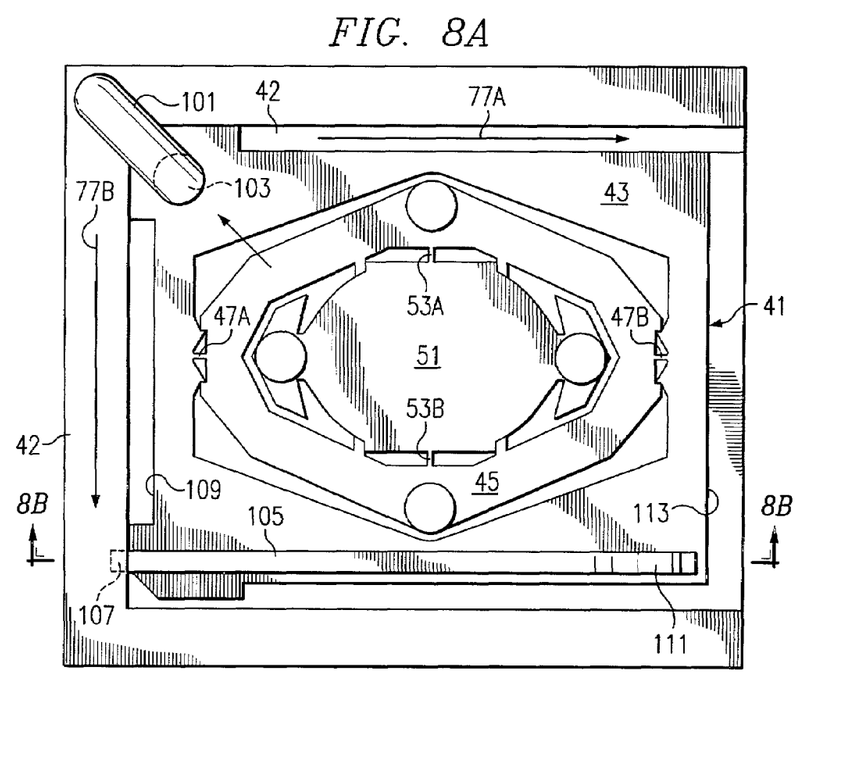
FIGS. 8a and 8b illustrate one embodiment of the present invention wherein a movable structure is mounted to a support structure by a clamp device, and which further includes a biasing member that allows relative motion between the movable structure and the support frame while preventing vibration movement in the third dimension.
Figure 8B:
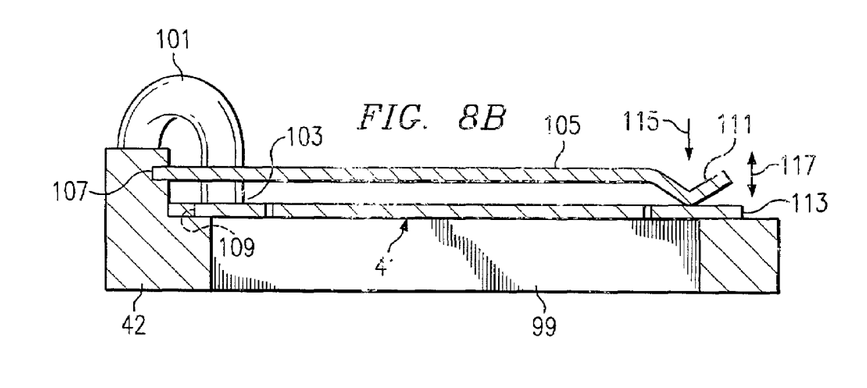

FIGS. 8a and 8b illustrate another embodiment of the invention which attaches the movable mirror assembly 41 to the support structure 42 by a single anchor. As shown, the movable mirror assembly 41 is placed on a support structure 42 which defines a cavity area 99 for allowing pivoted motion at either or both of the hinge pairs. Also, as discussed above, the support structure 42 may likely be made of a material having a different coefficient of expansion than the mirror assembly 41. However, instead of using a single spot or dab of epoxy as the anchor, this embodiment includes a single point clamp member 101 which is rigidly secured to an outside portion of support structure 42 as the anchor. The single point clamp or anchor extends to a single support or contact point 103 on the support portion of the mirror assembly 41 to attach the mirror assembly at its proper location. As was the case with the embodiment discussed above which used epoxy as the anchor, the clamped mirror assembly is free to expand or contract along two dimensions with respect to the single contact point 103 of the clamp 101 as indicated by arrows 77A and 77B.

A further embodiment is also illustrated in FIGS. 8a and 8b. As shown, a biasing member or finger 105 is securely mounted at a first end 107 to support structure 42 at a location which is adjacent a first edge 109 of the mirror assembly 41. Biasing member 105 extends from first end 107 to a second end 111 which is proximate second edge 113 of the mirror assembly 41. Also as shown, end 111 of biasing member 105 bears against support portion 43 of mirror assembly 41 with a force or pressure as indicated by arrow 115. The amount of force or pressure as indicated by arrow 115 is selected such that mirror assembly 41 will still slide under or move easily in the directions indicated by arrows 77A and 77B, but at the same time limit vibration or movement of the mirror assembly in the third dimension as indicated by double-headed arrow 117.

It should also be understood that although the biasing member 105 is shown in combination with clamp 101, it is also suitable for use in embodiments where the anchor used to attach the mirror assembly to the support substrate is a single spot or dab of adhesive or epoxy as discussed above.

The embodiments shown and discussed thus far have each had the capability for pivotal movement around first and second axis 49, 55. However, in a more simplified and limited embodiment, there may be only one pair of hinges and only one pivotal axis (not shown); thus limiting such embodiment to pivotal movement about the one axis. In such case, there would be no intermediate gimbals portion 45. Likewise, a more complex embodiment of the present invention may have more than two pivotal axis (e.g., three axis and two intermediate gimbals portions) (not shown).

Although the preferred embodiment shown and discussed herein was with respect to an optical switch application, other embodiments of the present invention may be incorporated into other types of optical devices, such as add-drop multiplexers, for example. Also, the present invention may be incorporated into types of devices (other than optical devices), such as a butterfly valve for controlling or directing fluid flow, for example. Therefore, a movable structure with torsional hinges attached to a support structure at a single location and subject to temperature variations may be incorporated into a wide range of devices and systems.

It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A torsional hinge apparatus having minimal hinge stress due to temperature variations comprising:

a support substrate having a first coefficient of expansion;

an integral torsional hinge device formed from a material having a different coefficient of expansion, and having an inside portion attached to a support portion along an axis by at least one pair of torsional hinges; and anchor means for attaching said support portion of said integral torsional hinge device to said support substrate to allow substantially unrestricted expansion and contraction along two dimensions of said integral torsional hinge device and to disallow movement with respect to said support substrate in a third dimension said anchor means consisting of a single anchor attaching said support portion of said integral torsional hinge device to said support substrate at a single location; and a biasing member attached to said support substrate and applying a force against said support portion of said integral torsional hinge device in said third direction another location spaced from said single location.

2. The torsional hinge apparatus of claim 1, wherein said anchor is an adhesive such as epoxy.

3. The torsional hinge apparatus of claim 1, wherein said support substrate defines a cavity to provide a space for rotation of said inside portion.

4. The torsional hinge apparatus of claim 1, wherein said support portion is substantially rectangular in shape, and said single location is proximate a corner of said support portion.

5. The torsional hinge apparatus of claim 4, wherein said anchor is a clamp.

6. The torsional hinge apparatus of claim 4, wherein said anchor is an adhesive such as epoxy.

7. The torsional hinge apparatus of claim 4, wherein said inside portion is a reflective surface.

8. The torsional hinge apparatus of claim 1, wherein said integral torsional hinge device further includes an intermediate portion attached to said inside portion by a first pair of hinges and to said support portion by a second pair of hinges to allow rotation of said intermediate portion and said inside portion with respect to said support portion.

9. The torsional hinge apparatus of claim 8 further comprising a biasing member attached to said support substrate and bearing against said support portion of said integral torsional hinge device at another location spaced from said single location.

10. The torsional hinge apparatus of claim 8, wherein said second pair of hinges are orthogonal to said first pair of hinges.

11. The torsional hinge apparatus of claim 1, wherein said inside portion is a reflective surface.

12. The torsional hinge apparatus of claim 1 wherein the integral torsional hinge device has unrestricted expansion and contraction along the two dimensions, except at the single location.

13. The torsional hinge apparatus of claim 1 wherein the integral torsional hinge device is actuated by an electromagnetic actuator.

14. The torsional hinge apparatus of claim 1 wherein the integral torsional hinge device has a mirror surface.

15. A torsional hinge apparatus having minimal hinge stress due to temperature variations comprising:

a support substrate having a first coefficient of expansion;

an integral torsional hinge device formed from a material having a different coefficient of expansion, and having an inside portion attached to a support portion along an axis by at least one pair of torsional hinges; and an anchor for attaching said support portion of said integral torsional hinge device to said support substrate at a single location to allow substantially unrestricted expansion and contraction along two dimensions of said integral torsional hinge device and to disallow movement with respect to said support substrate in a third dimension; and a biasing member attached to said support substrate and applying a force against said support portion of said integral torsional hinge device in said third dimension at another location spaced from said single location wherein said anchor is a clamp.

16. A method of manufacturing a torsional hinge apparatus for rotation about a pair of hinges having minimal hinge stress due to temperature variations comprising the steps of:

providing a support substrate having a first coefficient of expansion;

providing an integral torsional hinge device formed from a material having a different coefficient of expansion, and having an inside portion attached to a support portion along an axis by at least one pair of torsional hinges; and attaching said support portion of said integral torsional hinge device to said support substrate so as to allow substantially unrestricted expansion and contraction along two dimensions of said integral torsional hinge device and to disallow movement with respect to said support substrate in a third dimension at single location utilizing a single anchor; and restraining said support portion from movement due to vibrations and inertia forces by applying a biasing force in said dimension at a location on said support portion of said integral torsional hinge device spaced from said single location.

17. The mirror device of claim 16, wherein said step of providing an integral torsional hinge device comprises the further step of said integral torsional hinge device further including an intermediate portion attached to said inside portion by a first pair of hinges and to said support portion by a second pair of hinges so as to allow rotation of said intermediate portion and said inside portion with respect to said support portion.

18. The method of claim 17 further comprising the step of restraining said support portion from movement due to vibrations and inertia forces by applying a biasing force at a location on said support portion of said integral torsional hinge device spaced from said single location.

19. The method of claim 17, wherein said second pair of hinges are orthogonal to said first pair of hinges.

20. The method of claim 16 wherein the integral torsional hinge device has a mirror surface.

21. A mirror apparatus for rotation about a pair of hinges having minimal hinge stress of the mirror due to temperature variations comprising:

a support substrate having a first coefficient of expansion;

an integral mirror device formed from a material having a different coefficient of expansion, and having a mirror portion attached to a support portion along an axis by at least one pair of torsional hinges; and an anchor for attaching said support portion of said integral mirror device to said support substrate at a single location to allow substantially unrestricted expansion and contraction along two dimensions of said integral mirror device and to disallow movement with respect to said support substrate in a third dimension; and a biasing member attached to said support substrate and applying a force against said mirror support portion of said integral mirror device in said third dimension at another location spaced from said single location, wherein said anchor is a clamp.

22. A mirror apparatus for rotation about a pair of hinges having minimal hinge stress of the mirror due to temperature variations comprising:

a support substrate having a first coefficient of expansion;

an integral mirror device formed from a material having a different coefficient of expansion, and having a mirror portion attached to a support portion along an axis by at least one pair of torsional hinges; and an anchor for attaching said support portion of said integral mirror device to said support substrate at a single location to allow substantially unrestricted expansion and contraction along two dimensions of said integral mirror device and to disallow movement with respect to said support substrate in a third dimension; and a biasing member attached to said support substrate and applying a force against said mirror support portion of said integral mirror device in said third dimension at another location spaced from said single location, wherein said integral mirror device further includes an intermediate portion attached to said mirror first pair of hinges and to said support portion by a second pair of hinges to allow rotation of said intermediate portion and said mirror portion with respect to said support portion, and wherein said anchor is a clamp.

* * * * *